United States Patent
Gillies et al.

(10) Patent No.: US 6,438,026 B2
(45) Date of Patent: Aug. 20, 2002

(54) MAGNETIC FIELD ELEMENT HAVING A BIASING MAGNETIC LAYER STRUCTURE

(75) Inventors: Murray Fulton Gillies; Antonius Emilius Theodorus Kuiper; Kars-Michiel Hubert Lenssen, all of Eindhoven (NL)

(73) Assignee: Koninklijke Philips Electronics N.V., New York, NY (US)

( * ) Notice: Subject to any disclaimer, the term of this patent is extended or adjusted under 35 U.S.C. 154(b) by 0 days.

(21) Appl. No.: 09/801,629

(22) Filed: Mar. 8, 2001

(30) Foreign Application Priority Data

Mar. 9, 2000 (NL) .......................................... 00200830

(51) Int. Cl.[7] .............................................. G11C 11/00
(52) U.S. Cl. ...................................... 365/158; 365/171
(58) Field of Search ................................. 365/158, 173, 365/171

(56) References Cited

U.S. PATENT DOCUMENTS

| | | | |
|---|---|---|---|
| 5,729,410 A | 3/1998 | Fontana et al. ............. 360/113 |
| 6,023,395 A | 8/2000 | Dill et al. ................... 360/113 |
| 6,252,796 B1 * | 6/2001 | Lenssen et al. ............. 365/173 |
| 6,259,586 B1 * | 7/2001 | Gill ........................... 360/324.2 |
| 6,266,218 B1 * | 7/2001 | Carey et al. ........... 360/324.12 |

* cited by examiner

Primary Examiner—Vu A. Le
(74) Attorney, Agent, or Firm—Steven R. Biren

(57) ABSTRACT

A magnetic field element provided with a stack of a first magnetic layer structure (7), a second magnetic layer structure (11) having a substantially fixed direction of magnetization ($M_{11}$), and a spacer layer structure (9) separating the first magnetic layer structure and the second magnetic layer structure from each other. The magnetic field element is further provided with a biasing means for applying a longitudinal bias field to the first magnetic layer structure, which biasing means includes a thin biasing magnetic layer structure (3) located opposite to the first magnetic layer structure. The biasing magnetic layer structure provides a magnetic coupling field component ($M_3$) perpendicular to the direction of magnetization of the second magnetic layer structure and is separated from the first magnetic layer structure by a non-magnetic layer structure (5). The first magnetic layer structure is ferromagnetically coupled to the biasing magnet layer structure. The magnetic field element is suitable for very high density applications.

14 Claims, 4 Drawing Sheets

MAGNETIC FIELD ELEMENT HAVING A BIASING MAGNETIC LAYER STRUCTURE

Figure 1:
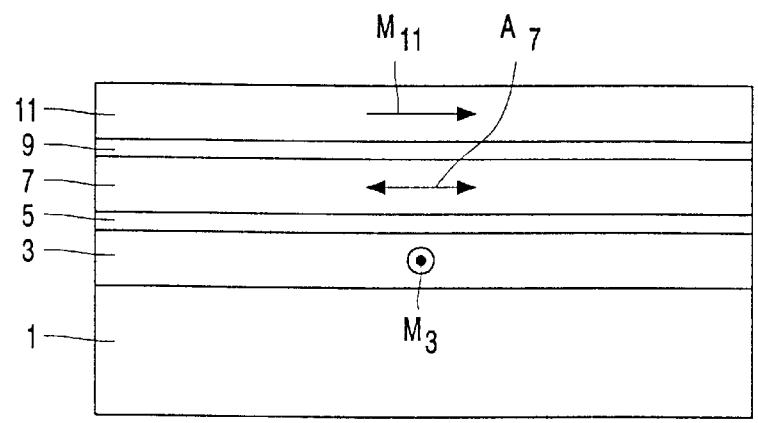

The invention relates to a magnetic field element provided with a stack of a first magnetic layer structure, a second magnetic layer structure having a substantially fixed direction of magnetization, and a spacer layer structure separating the first magnetic layer structure and the second magnetic layer structure from each other, the magnetic field element being further provided with a biasing means for applying a longitudinal bias field to the first magnetic layer structure.

U.S. Pat. No. 6,023,395 discloses a magnetic tunnel junction magnetoresistive sensor for sensing external magnetic fields. A magnetic tunnel junction device comprises a fixed ferromagnetic layer and a sensing ferromagnetic layer mutually separated by an insulating tunnel barrier layer and is based on the phenomenon of spin-polarized electron tunneling. The response of magnetic tunnel junction devices is determined by measuring the resistance of the magnetic tunnel junction when a sense current is passed perpendicularly through the magnetic tunnel junction from one ferromagnetic layer to the other ferromagnetic layer. Magnetic tunnel junction devices suffer from the problem of maintaining a single magnetic domain state. Shifting domain walls cause noise and reduce the signal-to-noise ratio. This may give rise to a non-reproducible response of the sensor, when a linear response is required. In view of this problem the known magnetic tunnel junction magnetoresistive sensor is provided with a biasing ferromagnetic layer in the magnetic tunnel junction stack of layers that is magnetostatically coupled with the sensing ferromagnetic layer. A non-magnetic electrically conductive spacer layer is present between the biasing layer and the other layers of the stack, such that a ferromagnetic coupling between the biasing layer and the sensing ferromagnetic layer is prevented. The demagnetizing field from the biasing ferromagnetic layer magnetostatically couples with the edges of the sensing ferromagnetic layer. In this way, wherein the spacer layer is of sufficient thickness, the magnetic moments of the sensing layer and the biasing layer are magnetically coupled to one another via an antiferromagnetic coupling field which results from the magnetostatic coupling of the edges of the sensing and biasing layers.

A disadvantage of the known sensor is that the degree of magnetic coupling of the sensing layer with the biasing layer depends on the geometry of the element, particularly the relevant layers thereof. Further, an antiferromagnetic magnetostatic coupling requires a thick spacer layer in order to suppress a possible ferromagnetic coupling, however, such a thick layer introduces undesired electrical shunting in case of a current-in-plane configuration. This effect makes an antiferromagnetic coupling mechanism practically unsuitable for application in GMR or AMR elements. In this context it is noted that the disclosed measure is only related to magnetic tunnel junction magnetoresistive sensors.

It is an object of the invention to improve the magnetic field element of the kind described in the opening paragraph, in such a way that the magnetic coupling induced by the biasing means is relatively independent of the geometry of the field element.

This object is achieved with the magnetic field element according to the invention which field element is provided with a stack of a first magnetic layer structure, a second magnetic layer structure having a substantially fixed direction of magnetization, and a spacer layer structure separating the first magnetic layer structure and the second magnetic layer structure from each other, the magnetic field element being further provided with a biasing means for applying a longitudinal bias field to the first magnetic layer structure, wherein the biasing means includes a biasing magnetic layer structure located opposite to the first magnetic layer structure, which biasing magnetic layer structure provides a magnetic coupling field component perpendicular to the direction of magnetization of the second magnetic layer structure and is separated from the first magnetic layer structure by a nonmagnetic layer structure, whereby the first magnetic layer structure is mainly ferromagnetically coupled to the biasing magnetic layer structure The longitudinal bias field is directed perpendicularly to the fixed direction of magnetization of the second magnetic layer structure. The applied measure causes a magnetic coupling between the biasing magnetic layer structure and the first magnetic layer structure through the non-magnetic layer structure. During manufacturing of the magnetic field element the biasing magnetic layer structure can be realized in a simple way using technology already existing. During forming of the biasing magnetic layer structure a magnetic field should be applied which makes an angle larger than 0° and smaller than 180° with the field applied during forming of the second magnetic layer structure.

The biasing means applied into the field element is applicable in sensors of different sensing principles. The magnetic field element according to the invention can be a spin tunnel junction element, in which case the spacer layer structure includes a tunnel barrier layer of an insulating material, such as $Al_2O_3$, or a spin-valve element of the giant magneto-resistive type. In both cases a very important magnetic characteristic is the magnetic hysteresis of the first magnetic layer structure. When the magnetic moment of this layer structure is aligned with a magnetic field of a magnetic source, e.g. a passing magnetic disk, an anti-parallel alignment with the magnetic moment of the second magnetic layer structure may be achieved. This effect gives rise to a change in resistance. In order to prevent a distortion in the output of the magnetic field element it is essential to prevent the introduction of domain walls moving erratically through the first magnetic layer structure during said magnetic alignment. Domain walls may be introduced if a magnetic hysteresis exists in the first magnetic layer structure. It has been proved that said hysteresis is reduced considerably and even completely eliminated in the sensor according to the invention.

In the magnetic field element according to the invention a magnetic coupling field, i.e. a longitudinal biasing field, between the biasing magnetic layer structure and the first magnetic layer structure exists. The resulting coupling is mainly ferromagnetic, i.e. that the ferromagnetic coupling is dominant over possibly present antiferromagnetic couplings. This dominance can be obtained by carefully choosing the thickness of the spacer layer structure as function of the ferromagnetic materials of the relevant layer structures. The ferromagnetic coupling is defined over a large area, i.e. in principle over the opposing faces of the biasing layer structure and the first layer structure, on a very local level, i.e. of the order of the size of the grains of the structures. More precise, the desired ferromagnetic coupling is obtained by exploiting the ferromagnetic coupling due to the waviness or roughness of magnetic layer structures. This coupling is also called orange-peel coupling or topological coupling. In this invention the correlated waviness of the biasing magnetic layer structure and the first magnetic layer structure, which structures are separated by the nonmagnetic spacer layer structure of sufficient thickness, causes the ferromagnetic coupling. In the case of parallel magnetizations the magnetic flux crosses the spacer structure from the magnetic structure to the others; this makes the situation with parallel magnetizations energetically favorable over an antiparallel configuration.

By making the spacer layer structure sufficiently thin, e.g. in the case of use of Ta as spacer material the thickness is typically less than about 3 nm, and choosing the saturation magnetization of a ferromagnetic layer in the biasing layer structure sufficiently large, it can be assured that the ferromagnetic coupling is dominant over magnetostatic antiferromagnetic coupling and therefore that the ferromagnetic coupling is relatively independent of the geometry of the field element and homogeneous over at least a large part of the element.

The above described measure allows much lower magnetic fields to be applied than are possible with other biasing means. Due to the interactions on a microscopic level the ferromagnetic coupling is homogeneous over the main part of the field element and is hardly dependent on the dimensions and surroundings of the magnetic field element. Moreover, the biasing means is of a simple nature and offers a viable solution for very high density applications. An alternative mechanism for ferromagnetic coupling could be to make use of interlayer exchange coupling, in that case the thickness of the layers has to be chosen very carefully.

Generally, the first magnetic layer structure will have an easy axis of magnetization which is perpendicular to the fixed direction of magnetization of the second magnetic layer structure. The first magnetic layer structure generally includes a ferromagnetic layer of a ferromagnetic material, such as an NiFe alloy or CoFe alloy, the ferromagnetic layer being a so-called free layer. The second magnetic layer structure may include a so-called pinned layer of a ferromagnetic material, such as a NiFe alloy or a CoFe alloy, and a so-called pinning layer of an exchange biasing material, such as an anti-ferromagnetic material, e.g. an IrMn alloy.

It is to be noted that U.S. Pat. No. 5,729,410 discloses a known magnetic field element used as a sensor which is used for reading magnetically recorded data and has one fixed ferromagnetic layer and one sensing ferromagnetic layer, formed on opposite sides of an insulating tunnel barrier layer. Two layer portions of hard biasing ferromagnetic material, particularly a CoPtCr alloy, are located near to but spaced from side edges of the sensing ferromagnetic layer. Said layer portions are electrically insulated from but magnetostatically coupled with the sensing ferromagnetic layer and serve to longitudinally bias the magnetic moment of this sensing layer. A disadvantage of this known sensor is that the layer portions of hard biasing material are difficult to control and are only really practical for large track widths where such magnets are far apart and the resulting field is both of a low value, e.g. 5 to 10 Oe, and homogeneous. It is not a suitable solution for very high density recording.

Another disadvantage of the known sensor is that said layer portions are made from a material which is not used anywhere else in the sensor. This requires extra sources in a deposition system. Furthermore, extra mask steps are required during manufacturing to define the structure of said layer portions. Moreover, hard magnetic materials often show a strong temperature dependence.

An embodiment of the magnetic field element in accordance with the invention is characterized in that the biasing magnetic layer structure has a fixed direction of magnetization having an angle of at least 45° and at most at an angle of 135° relative to the direction of magnetization of the second magnetic layer structure. In this preferred embodiment the biasing magnetic layer structure has a remarkable effect on the first magnetic layer structure, in the sense that the magnetic hysteresis in the first magnetic layer structure is substantially reduced. A maximum longitudinal biasing field is achieved in the embodiment which is characterized in that the direction of magnetization of the biasing magnetic layer structure has an angle of substantially 90° relative to the direction of magnetization of the second magnetic layer structure.

In an embodiment of the magnetic field element in accordance with the invention the non-magnetic layer structure includes a layer of one or more of the materials Cu, Ru and Ta and/or a non-magnetic oxide, such as $Al_2O_3$. By adjusting the thickness of this layer the longitudinal biasing field can be tuned, e.g. from about 5 Oe for a very thick Cu layer to several 100 Oe for a very thin Cu layer. Ta is preferred, in particular in a spin-valve element, because of its high resistivity. Moreover Ta induces a desired texture.

An embodiment of the magnetic field element in accordance with the invention is characterized in that the biasing magnetic layer structure includes a pinned layer structure and a pinning layer structure for pinning the pinned layer structure. The pinned layer structure preferably includes a ferromagnetic layer of a magnetic material, e.g. an NiFe alloy, Co or a CoFe alloy.

The last-mentioned embodiment of the magnetic field element in accordance with the invention is preferably further characterized in that the pinning layer structure includes a layer of an exchange-biasing material, such as an anti-ferromagnetic material, e.g. an FeMn alloy, an IrMn alloy or a ferrimagnetic material, e.g. an TbCo alloy or an TbFeCo alloy.

If desired the pinned layer structure may include two ferromagnetic layers separated by a layer of a non-magnetic material. The structure may be e.g. two layers of a ferromagnetic material, such as an NiFe alloy or a CoFe alloy, and an interposed layer of a suitable thickness and of a non-magnetic material, such as Ru, Rh or Cu. The interposed layer results in an anti-ferromagnetic coupling between the layers of a ferromagnetic material. Such a structure comprising layers of a ferromagnetic material separated by interposed layers of a non-magnetic material is often called an artificial antiferromagnet (AAF).

An embodiment of the magnetic field element in accordance with the invention is characterized as defined in claim 8. In this embodiment a magnetic stray field may be minimized.

An embodiment of the magnetic field element in accordance with the invention is characterized as defined in claim 9. The magnetic robustness of the biasing magnetic layer structure is further improved in this embodiment.

The invention further relates to a spin tunnel junction device comprising a magnetic field element. The spin tunnel junction device in accordance with the invention is provided with the magnetic field element in accordance to the invention, the spacer layer structure including a tunnel barrier layer of e.g. an insulating material, such as $Al_2O_3$.

The invention further relates to a giant magneto-resistive device comprising a magnetic field element. The giant magneto-resistive device in accordance with the invention includes the magnetic field element in accordance with the invention. An insulating material, such as $Al_2O_3$, or a material of high resistivity, such as Ta, W, or Mo, is preferred as material for the non-magnetic layer.

Both above-mentioned devices can be used as sensors, e.g. field sensors for automotive applications or magnetic heads, such as read heads, for cooperation with a magnetic registration or information medium.

The invention further relates to a system for reading information from a magnetic information carrier, which system includes the magnetic field element in accordance with the invention or one of the devices in accordance with the invention.

The invention further relates to a magnetic memory including the magnetic field element according to the invention and to an electronic circuit comprising such a memory.

With reference to the Claims, it is noted that various characteristic features as defined in the set of Claims may occur in combination. Moreover, it is to be noted that wherever the expression "layer structure" wherever used in this document it may refer to a single layer or a stack of layers.

The above-mentioned and other aspects of the invention are apparent from and will be elucidated, by way of non-limitative example, with reference to the embodiments described hereinafter.

Figure 2:
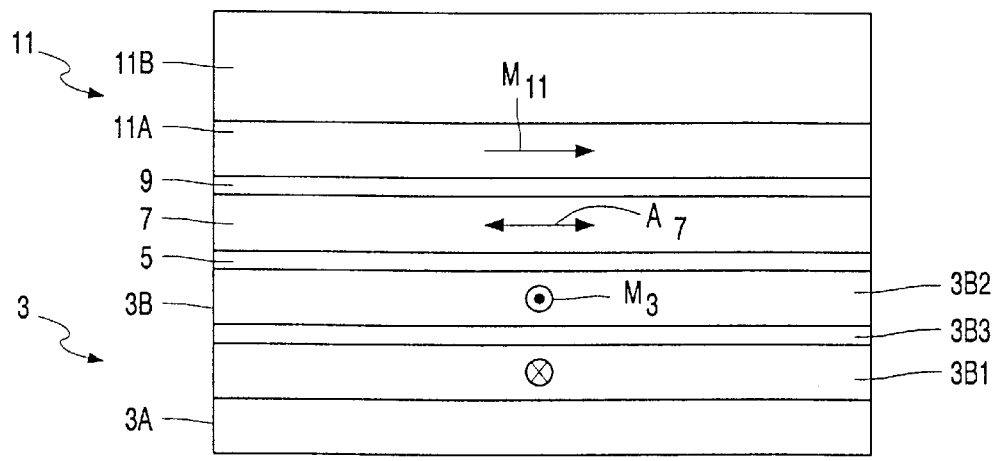
Figure 3:
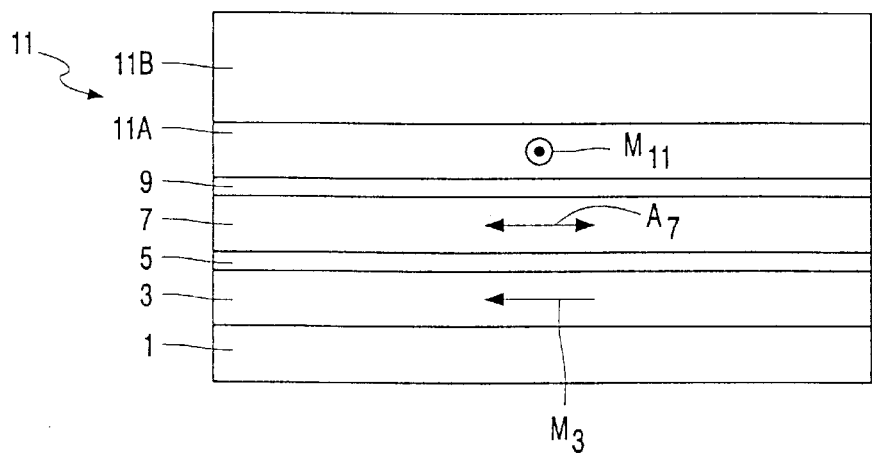
Figure 4:
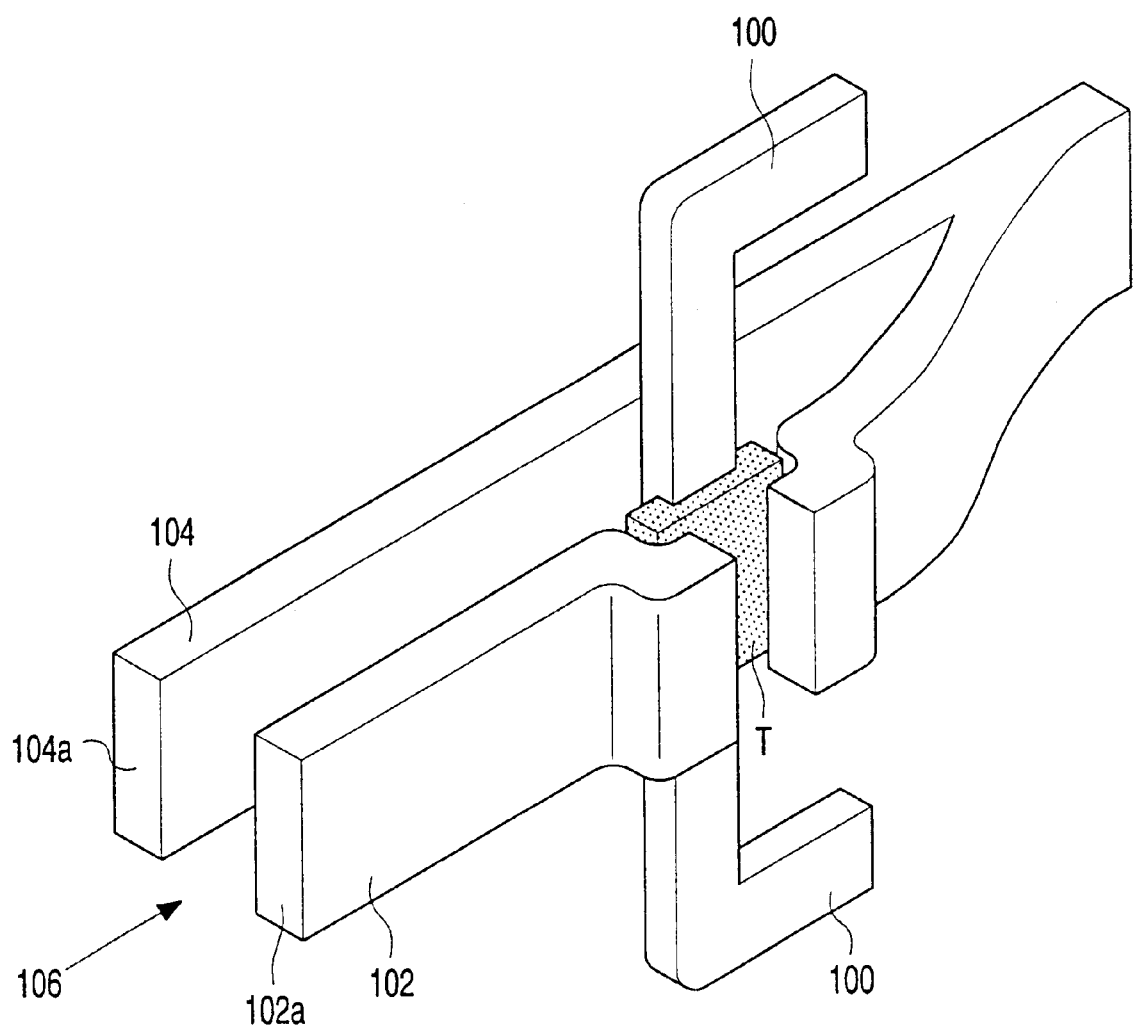

In the drawings:

FIG. 1 is a diagrammatic cross-sectional view of an embodiment of the magnetic field element according to the invention, FIG. 2 is a diagrammatic cross-sectional view of an embodiment of a spin-valve element of the giant magneto-resistive type according to the invention, FIG. 3 is a diagrammatic cross-sectional view of an embodiment of the spin tunnel junction device according to the invention, FIG. 4 renders a diagrammatic perspective view of an embodiment of a magnetic field sensor provided with the magnetic field element according to the invention.

Figure 5:
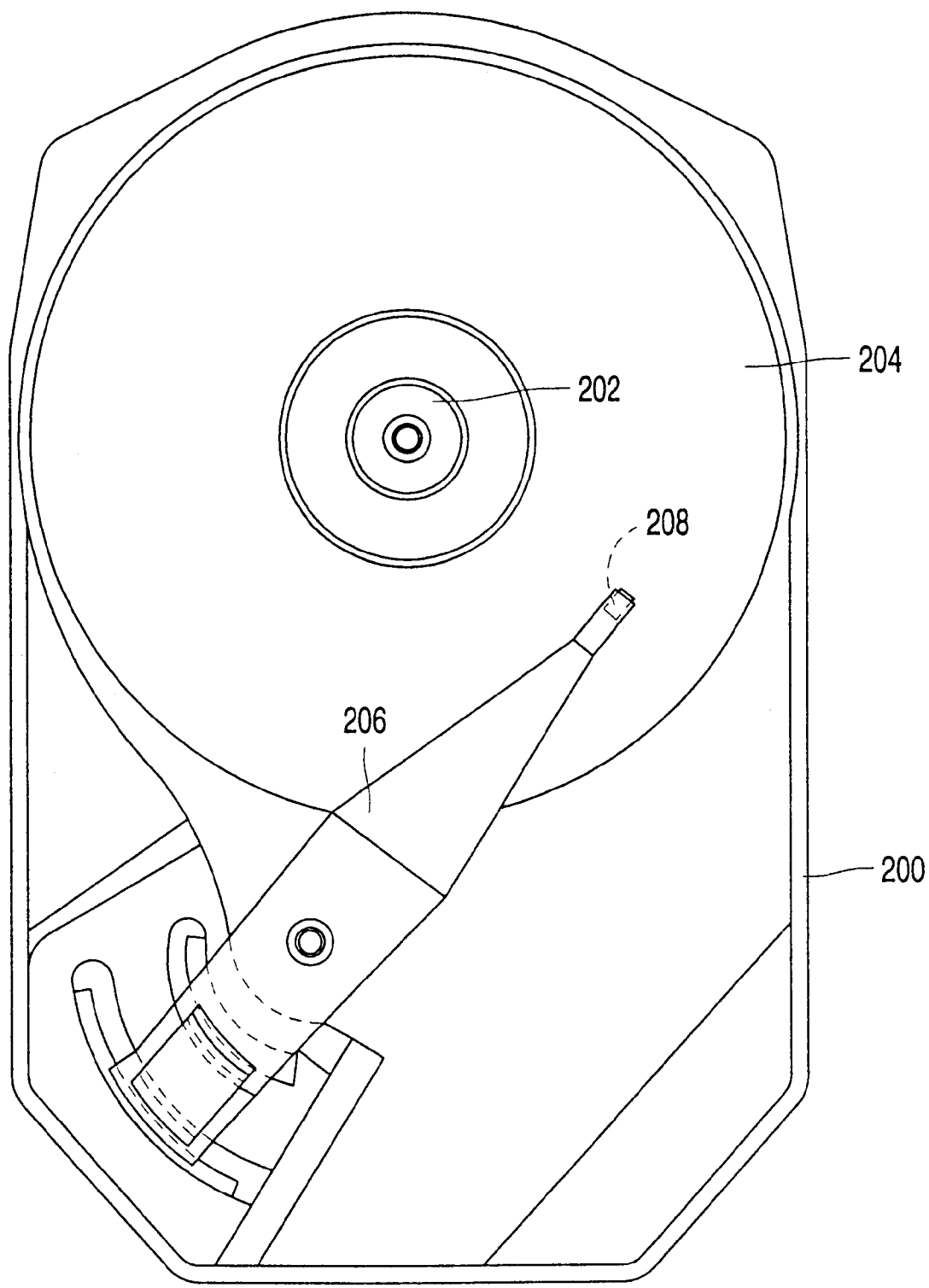
Figure 6:
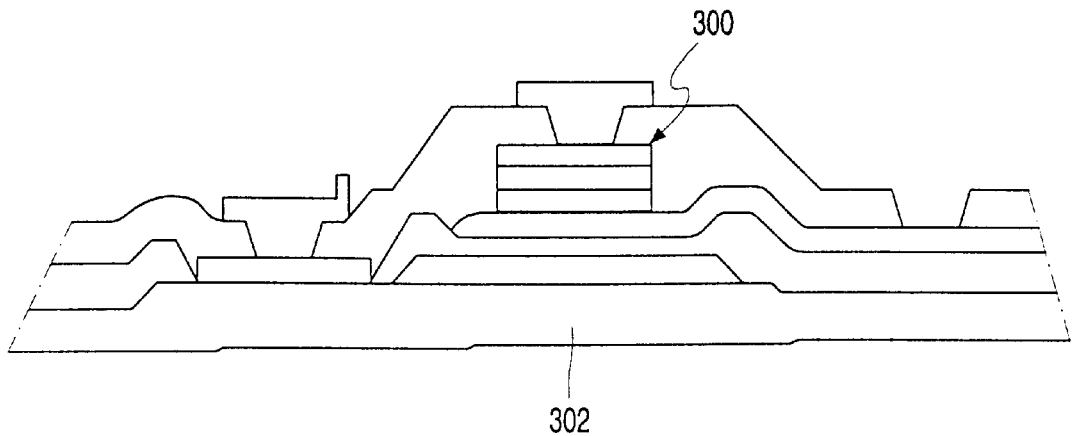
Figure 7:
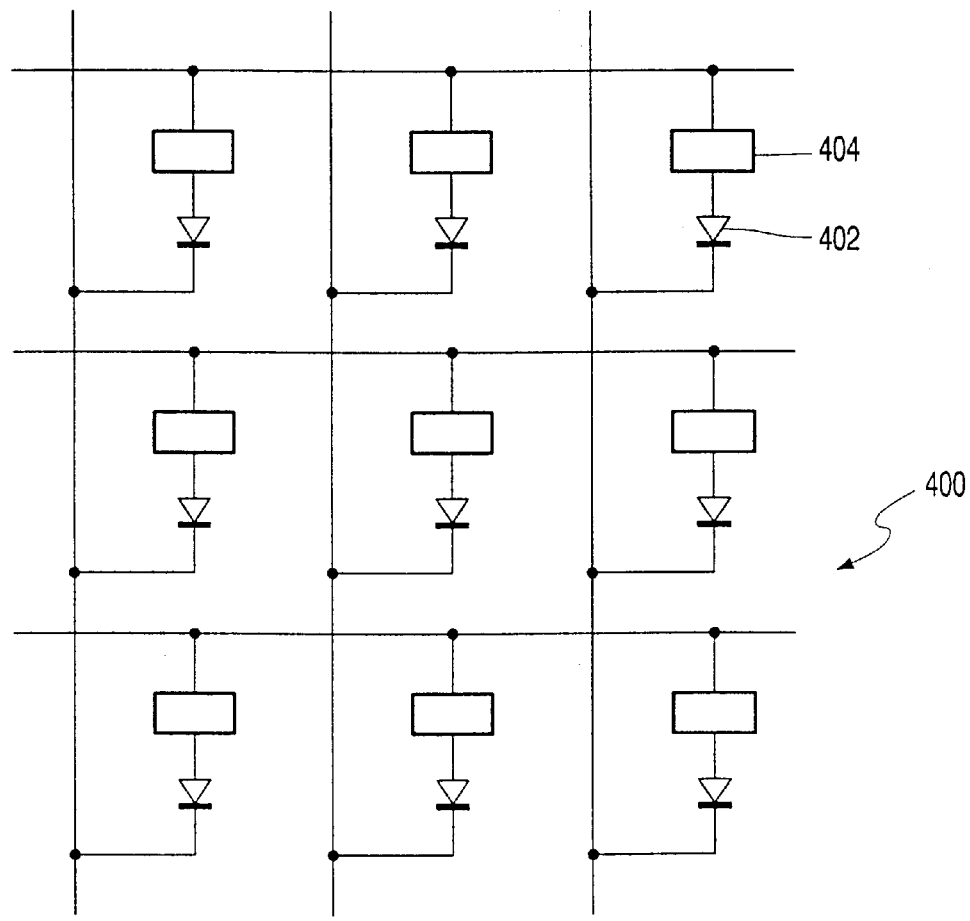

FIG. 5 shows diagrammatically an embodiment of the system according to the invention, FIG. 6 is a diagrammatic cross-sectional view of an embodiment of a magnetic memory according to the invention and FIG. 7 renders a diagrammatic view of an electronic circuit according to the invention.

It is to be noted that the same reference signs will be used to indicate corresponding parts of the several embodiments.

The magnetic field element shown in FIG. 1 is provided with a stack of substantially parallel layer structures supported by a substrate 1. The stack of layer structures successively includes a biasing magnetic layer structure 3, a thin non-magnetic layer structure 5, a first magnetic layer structure 7, a spacer layer structure 9 and a second magnetic layer structure 11. The substrate 1 may be comprised of a non-magnetic, non-conducting material, such as Si. The first magnetic layer structure 7 and the second magnetic layer structure 11 are sandwiched about the spacer layer structure 9, whilst the biasing layer structure 3 and the first magnetic layer structure 7 are sandwiched about the non-magnetic layer structure 5. Each of the layer structures 3, 5, 7, 9 and 11 may include a single layer or a multilayer. The second magnetic layer structure 11 has a fixed direction of magnetization $M_{11}$ in the plane of the layer structure 11 itself. The direction of magnetization $M_{11}$ has been introduced during manufacturing of the magnetic field element by applying a suitable magnetic field during forming, in particular depositing of the second magnetic layer structure 11.

The biasing magnetic layer structure 3, which is located opposite to the first magnetic layer structure 7, has a magnetization $M_3$ which provides a magnetic coupling field component parallel to the magnetization $M_3$ and perpendicular to the direction of magnetization $M_{11}$ of the second magnetic layer structure 11. The direction of the magnetization $M_3$ has been realized during forming, in particular depositing, of the biasing magnetic layer structure 3 by applying a suitable magnetic field which makes an angle between 0° and 180° with the field applied during forming of the second magnetic layer structure 11. The magnetization $M_3$ produces a ferromagnetic coupling between the biasing magnetic layer structure 3 and the first magnetic layer structure 7 via the non-magnetic layer structure 5, which results in a very local coupling. Preferably, the magnetization $M_3$ of the biasing magnetic layer structure 3 has a fixed direction which having an angle of at least 45° and at most 135° relative to the direction of magnetization $M_{11}$ of the second magnetic layer structure 11. The maximum magnetic coupling field component is achieved if said direction of magnetization $M_3$ of the biasing magnetic layer structure has an angle of 90° relative to the direction of magnetization $M_{11}$. The first magnetic layer structure 7 has an easy axis of magnetization $A_7$ which is parallel to the fixed direction of magnetization $M_{11}$ of the second magnetic layer structure 11. Alternatively, in certain applications it may be advantageous to choose the easy axis of magnetization $A_7$ perpendicular to the fixed direction of magnetization $M_{11}$. The first magnetic layer structure 7 may include a so-called free layer comprised of a ferromagnetic material, e.g. $Ni_xFe_{1-x}$. The second magnetic layer structure 11 may include a so-called pinned layer of a ferromagnetic material, e.g. $Co_xFe_{1-x}$, or a so-called pinned layer of an exchange biasing material, such as an anti-ferromagnetic material, e.g. $Fe_{50}Mn_{50}$.

The magnetic field element according to the invention may be used in a spin tunnel junction device, in which case the spacer layer structure 9 includes a tunnel barrier layer of an electrically insulating material, e.g. $Al_2O_3$, or may be used in a giant magnetoresistive device, in which case the spacer layer structure 9 includes a layer of a non-magnetic material, e.g. Cu.

The thin non-magnetic layer structure 5 having a thickness of smaller than 3 nm may include one or more layers of a non-magnetic material, such as the elements Cu, Ru or Ta, or the oxide $Al_2O_3$ or another suitable material. The biasing layer structure 3 may include a stack of a pinned layer structure and a pinning layer structure. The pinned layer structure preferably comprises two layers of a ferromagnetic material, such as an NiFe alloy, separated by a layer of a non-magnetic material, such as Cu, whilst the pinning layer structure preferably comprises a layer of an exchange-biasing material, such as an antiferromagnetic material, e.g. an FeMn alloy, or a suitable ferrimagnetic material, e.g. an TbCo alloy. Preferably one of the ferromagnetic layers is adjacent to the layer of an exchange-biasing material. Alternatively, the biasing layer structure 3 may include two ferromagnetic layers separated by a layer of a non-magnetic material.

The giant magneto-resistive device shown in FIG. 2 may comprise a substrate and comprises a magnetic field element provided with a stack of layer structures including a biasing layer structure 3, a thin non-magnetic layer structure 5, a first magnetic layer structure 7, a spacer layer structure 9, a second magnetic layer structure 11. The biasing layer structure 3 has a magnetization $M_3$ which is perpendicular to the fixed direction of magnetization $M_{11}$ of the second magnetic layer structure 11. The biasing magnetic layer 3 includes a pinned layer structure 3B and a pinning layer structure 3A for pinning the structure 3B. The pinning layer 3A includes a layer of an exchange-biasing material, in this embodiment an IrMn alloy. In this embodiment the pinned layer structure 3B includes two layers $3B_1$ and $3B_2$ of a ferromagnetic material, separated by an interposed layer $3B_3$ of a non-magnetic material. The ferromagnetic material is a CoFe alloy and the non-magnetic material is Ru in this embodiment. The structure of the layers $3B_1$ $3B_2$ and $3B_3$ results in an anti-ferromagnetic coupling between the ferromagnetic layers $3B_1$ and $3B_2$. In this embodiment the non-magnetic layer structure 5 which has a thickness of 2 nm includes a layer of Ta. The first magnetic layer structure 7 includes a free layer of a ferromagnetic material, e.g. an NiFe alloy. The spacer layer structure 9 includes a layer of Cu. The second magnetic layer structure 11 is a pinned structure having a pinned layer 11A and a pinning layer 11B. The second magnetic layer structure 11 has a fixed direction of magnetization $M_{11}$ and the biasing layer structure 3 provides a magnetic coupling field component perpendicular to the direction of magnetization $M_{11}$.

The spin tunnel junction device shown in FIG. 3 comprises a magnetic field element provided on a substrate 1 and provided with a stack of a biasing magnetic layer structure 3, a non-magnetic layer structure 5, a first magnetic layer structure 7, a spacer layer structure 9 and a second magnetic layer structure 11. The spacer layer structure 9 includes a tunnel barrier layer of a non-magnetic, electrically insulating material, such as a suitable oxide, e.g. $Al_2O_3$. The layer structures 3, 5 and 11 may be composed as in the embodiments already described. The first magnetic layer structure 7 is mainly ferromagnetically coupled to the biasing layer structure 3.

FIG. 4 renders a part of a magnetic field sensor. The sensor comprises a transducer T with electrical connections 100. The transducer T includes an embodiment of the magnetic field element according to the invention, e.g. one of the embodiments as shown in FIGS. 1 to 3. The sensor comprises flux guides 102, 104, which are positioned relative to the transducer T so as to form a magnetic circuit. The flux guides 102, 104 have end faces 102a, 104a forming pole faces of the sensor, a magnetic gap 106 being located between said faces. If a magnetic medium, such as a magnetic tape, disc or card, moves past the faces 102a, 104a in close proximity thereto, magnetically-stored information on that medium will generate a varying magnetic flux in the above-mentioned magnetic circuit, which flux is also fed through the transducer T. The transducer T converts the varying magnetic flux into electrical resistance variations, which can be measured by a suitably measuring instrument connected to the electrical connections 100. Such a sensor, also referred to as a magnetic head, may also include an induction coil, which can be employed in the recording of magnetic information on a magnetic medium.

The system according to the invention shown in FIG. 5 includes a frame 200 and a spindle 202 rotatably mounted in the frame 200 for carrying a disc-like information carrier 204, such as a hard disc or a magneto-optical disc. The information carrier 204 may be an integrated carrier or a removable carrier. The system further includes a swing-arm 206 carrying a magnetic field sensor 208 according to the invention. Drives are provided for driving the spindle 202 and the arm 206. In an operational state the sensor 208 scans the rotating information carrier 204, the sensor being disposed opposite to the information carrier 204 and moving substantially radially with respect to the carrier 204. The system shown is a data storage system, but may be for example an audio and/or video system. The system according to the invention may also be a system for reading information from a tape or card.

In FIG. 6 a spin tunnel junction device 300 according to the invention is integrated on top of semiconductor device 302, such as a transistor, e.g. an Si transistor, or a diode, e.g. a GaAs diode, forming a cell of a high-density non-volatile memory.

FIG. 7 shows a floor plan 400 for a high-density MRAM. The plan 400 includes memory cells comprising a selection device 402, e.g. a diode or a transistor, and a magnetic component 404 in the form of a spin tunnel junction device according to the invention or a giant magneto-resistive device according to the invention.

What is claimed is:

1. A magnetic field element provided with a stack of a first magnetic layer structure having an easy axis of magnetization, a second magnetic layer structure having a substantially fixed direction of magnetization parallel to said easy axis of magnetization, and a non-magnetic or electrically insulating spacer layer structure separating the first magnetic layer structure and the second magnetic layer structure from each other, the magnetic field element being further provided with a biasing means for applying a longitudinal bias field to the first magnetic layer structure, wherein the biasing means includes a biasing magnetic layer structure located opposite to the first magnetic layer structure, which biasing magnetic layer structure provides a magnetic coupling field component perpendicular to the direction of magnetization of the second magnetic layer structure and is separated from the first magnetic layer structure by a non-magnetic layer structure, whereby the first magnetic layer structure is mainly ferromagnetically coupled to the biasing magnetic layer structure.

2. A magnetic field element according to claim 1, characterized in that the biasing magnetic layer structure has a fixed direction of magnetization having an angle of at least 45° and at most 135° relative to the direction of magnetization of the second magnetic layer structure.

3. A magnetic field element according to claim 2, characterized in that the direction of magnetization of the biasing magnetic layer structure has an angle of substantially 90° relative to the direction of magnetization of the second magnetic layer structure.

4. A magnetic field element according to claim 1, characterized in that the non-magnetic layer structure includes a layer of Ta.

5. A magnetic field element according to claim 1, characterized in that the biasing magnetic layer structure includes a pinned layer structure and a pinning layer structure for pinning the pinned layer structure.

6. A magnetic field element according to claim 5, characterized in that the pinning layer structure includes a layer of an exchange-biasing material.

7. A magnetic field element according to claim 5, characterized in that the pinned layer structure includes two ferromagnetic layers separated by a layer of a non-magnetic material.

8. A magnetic field element according to claim 1, characterized in that the biasing magnetic layer structure includes two ferromagnetic layers separated by a layer of a non-magnetic material.

9. A magnetic field element according to claim 6, characterized in that the biasing magnetic layer structure includes two ferromagnetic layers separated by a layer of a non-magnetic material, one of the ferromagnetic layers being adjacent to the layer of the exchange-biasing material.

10. A spin tunnel junction device comprising the magnetic field element according to claim 1, the spacer layer structure including a tunnel barrier layer.

11. A giant magneto-resistive device comprising the magnetic field element according to claim 1.

12. A system for reading information from a magnetic information carrier, which system includes the magnetic field element according to claim 1.

13. A magnetic memory including the magnetic field element according to claim 1.

14. An electronic circuit including the memory according to claim 13.

* * * * *